(12) United States Patent
Oonishi et al.

(10) Patent No.: US 6,273,959 B1
(45) Date of Patent: Aug. 14, 2001

(54) METHOD OF CLEANING SEMICONDUCTOR DEVICE

(75) Inventors: Teruhito Oonishi, Hirakata; Ken Idota, Moriguchi; Masaaki Niwa, Hirakata; Yoshinao Harada, Moriguchi, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/011,787

(22) PCT Filed: Jul. 7, 1997

(86) PCT No.: PCT/JP97/02351

§ 371 Date: Feb. 24, 1998

§ 102(e) Date: Feb. 24, 1998

(87) PCT Pub. No.: WO98/01897

PCT Pub. Date: Jan. 15, 1998

(30) Foreign Application Priority Data

Jul. 8, 1996 (JP) .................................... 8-177628

(51) Int. Cl.⁷ .................................................. C23G 1/02
(52) U.S. Cl. .................. 134/2; 134/3; 134/25.4; 134/26; 134/28; 134/29; 134/36; 134/40; 134/41; 134/42; 134/902; 510/175; 510/176; 510/375; 510/426
(58) Field of Search .................. 134/2, 3, 41, 25.4, 134/26, 28, 29, 36, 40, 42, 902; 510/175, 176, 375, 426

(56) References Cited

U.S. PATENT DOCUMENTS

| | | | |
|---|---|---|---|
| 4,165,294 | * 8/1979 | Mey | 510/176 |
| 4,165,295 | * 8/1979 | Mey | 510/176 |
| 4,215,005 | * 7/1980 | Mey | 510/176 |
| 5,238,500 | 8/1993 | Bergman | 134/3 |
| 5,294,570 | 3/1994 | Fleming, Jr. et al. | 437/239 |
| 5,389,194 | 2/1995 | Rostoker et al. | 156/636 |

FOREIGN PATENT DOCUMENTS

| | | |
|---|---|---|
| 2-98133 | 4/1990 | (JP) . |
| 4-234118 | 8/1992 | (JP) . |
| 5-67601 | 3/1993 | (JP) . |
| 5-138142 | 6/1993 | (JP) . |
| 6-333898 | 12/1994 | (JP) . |
| 7-283182 | 10/1995 | (JP) . |
| 8-45886 | 2/1996 | (JP) . |

OTHER PUBLICATIONS

Cleaning Solutions Based on Hydrogen Peroxide For Use In Silicon Semiconductor Technology, RCA Rev. 31. 189 (1970) Werner Kern and David A. Puotinen.

* cited by examiner

Primary Examiner—Sharidan Carrillo
(74) Attorney, Agent, or Firm—Parkhurst & Wendell, L.L.P.

(57) ABSTRACT

There is disclosed a semiconductor device cleaning method involving placing a cleaning solution containing 24 wt. % sulfuric acid, 5 wt. % hydrogen peroxide, 0.02 wt. % hydrogen fluoride, 0.075 wt. % n-dodecylbenzenesulfonic acid, and water into a quartz processing vessel and heating to no more than 100° C. A silicon wafer is immersed into the cleaning solution for 10 minutes and then washed by demineralized water for about 7 minutes. The surfaces of foreign particles on the wafer are etched by hydrogen fluoride, and n-dodecylbenzenesulfonic acid combines with the etched surfaces by sulfate ester bonding. The apparent diameter of the foreign particles increases and the repulsive force caused by zeta potential etc. increases, so that the foreign particles are unlikely to adhere to the surface of the silicon wafer permitting the foreign particles to be easily washed away in a water cleaning step.

23 Claims, 5 Drawing Sheets

METHOD OF CLEANING SEMICONDUCTOR DEVICE

TECHNICAL FIELD

The present invention relates to a cleaning method for semiconductor devices and more particularly to a cleaning method for removing organic and inorganic substances, minute particulate matter and other foreign contaminants which adhere to silicon wafers and the like, through a wet process.

BACKGROUND ART

One known cleaning method for semiconductor devices such as silicon wafers comprises two steps, that are, a first step for removing organic and inorganic substances and a second step for removing foreign particulate matter adhering to the surface of a semiconductor device.

In the first step, organic and inorganic substances are oxidized, dissolved, and removed using a cleaning solution which typically contains sulfuric acid and hydrogen peroxide. The second step is directed to removal of foreign particles by separating them from the surface of a semiconductor device with a cleaning solution typically containing ammonium hydroxide and hydrogen peroxide. Through these two steps, the cleanliness of a semiconductor device can be improved. The removal of foreign particles in the second step is described in W. Kern, D. A. Poutinen, RCA Rev., 31, 187 (1970).

Strictly speaking, the above cleaning method composed of the two steps requires another two steps, namely, water cleaning processes that are respectively carried out subsequent to the first step and to the second step for washing each cleaning solution away by water. Further, if removal of residues left on the surface of a semiconductor device after etching of silicon and a silicon oxide film is necessary, there arises a need for cleaning the semiconductor device with the same solution as used in etching. The above prior art method disadvantageously involves many steps, so that it has a difficulty in improving throughput and requires a large-sized cleaning system.

One proposal to carry out cleaning through fewer steps is set out in Japanese Patent Laid-Open Publication No. 4-234118 (1992) and Japanese Patent Application No. 6-47297 (1994).

This cleaning method uses, as a cleaning solution, a mixture of a strong acid such as sulfuric acid, an oxidizer such as hydrogen peroxide and a fluorine-containing compound such as hydrofluoric acid. In this method, organic and inorganic substances, etching residues and foreign particulate matter can be removed by one step.

Specifically, this method is designed such that while organic and inorganic substances being oxidized and dissolved away by use of the strong acid, the surface of a semiconductor device is slightly etched by the fluorine-containing compound to establish a chemophobic surface so that etching residues and foreign particles can be removed.

It has been reported (see, for example, Kitahara, Watanabe, "Electrical Surface Phenomenon", Kyoritsu Shuppan, p. 300) that the extent to which foreign particles can be removed is determined by the following factors.

The potential energy of a foreign particle depending on the distance between the particle and the surface of the semiconductor device is determined, as shown in FIG. 1(a), by the balance between a repulsive force caused by a potential ($\zeta$-potential) generated from electric charge on the particle surface and an attractive force caused by Van der Waals force.

If a semiconductor device and foreign particles are immersed in a solvent alkalified by aqueous ammonium hydroxide or the like, both semiconductor surface and particle surfaces are negatively charged under the influence of hydroxyl groups ($OH^-$), increasing the repulsive force due to $\zeta$-potential so that the potential energy is brought into the state shown in FIG. 1(b). As a result, the foreign particles become more likely to separate from the surface of the semiconductor device and unlikely to adhere to the surface of the semiconductor device again.

The above cleaning method provides easy removal of comparatively large foreign particles but has a difficulty in effectively removing minute foreign particles of about 0.1 $\mu$m or less.

The reason for this is that, in minute foreign particles, the repulsive force caused by $\zeta$-potential etc. is relatively small with the potential energy being as shown in FIG. 1(c), so that the foreign particles are likely to adhere to the surface of the semiconductor device again.

The reliable removal of minute foreign particles is becoming more and more important as the recent miniaturization of circuit patterns in semiconductor devices proceeds.

The present invention has been made in consideration of the above problems and one of the objects of the invention is therefore to provide a semiconductor device cleaning method capable of effectively removing minute foreign particles.

DISCLOSURE OF THE INVENTION

The invention is directed to overcoming the above problems. This purpose can be accomplished by a semiconductor device cleaning method wherein a semiconductor device is cleaned with a cleaning solution comprising a component which combines with foreign particles adhering to a surface of the semiconductor device and with foreign particles included in the cleaning solution, increasing the apparent diameter of the foreign particles.

By increasing the apparent diameter of the foreign particles using such a component, the surface area of the foreign particles can be increased and therefore repulsive force caused by $\zeta$-potential etc. can be relatively increased. As a result, the foreign particles are unlikely to adhere to the surface of the semiconductor device again once they separate from it. Even if they adhere to the surface of the semiconductor device again, they will easily come off. Accordingly, even minute foreign particles can be effectively removed. As the molecular weight of the component increases within a range which does not cause any stereostructural troubles, the effect of increasing the apparent diameter of the foreign particles increases and, generally, the bond between the component and the foreign particles can be more easily established.

The above component may be such a component that if the component combines with the surface of the semiconductor device, it may be dissociated from the surface of the semiconductor device by use of demineralized water or an organic compound. In this case, the cleaning method may be designed such that the semiconductor device is rinsed with demineralized water or an organic compound after being washed with the above cleaning solution.

Accordingly, even when this component combines with the surface of the semiconductor device, it can be easily removed from the surface, so that uncontaminated, clean semiconductor devices can be obtained.

One example of the above component is a compound which can combine with the foreign particles by sulfate ester bonding.

Such a compound can be easily combined with the foreign particles thereby easily increasing the apparent diameter of the foreign particles and can be easily removed from the surface of the semiconductor device by hydrolysis if it combines with the surface of the semiconductor device.

Examples of the compound which can combine with the foreign particles by sulfate ester bonding include compounds having sulfonic acid groups and benzene nucleuses such as toluenesulfonic acid and dodecylbenzenesulfonic acid.

Such compounds can easily increase the apparent diameter of the foreign particles and can combine with the foreign particles by sulfate ester bonding since they have relatively high molecular weights. Additionally, since they have benzene nucleuses and therefore high acid resistance, it is possible to add a strong acid such as sulfuric acid to the cleaning solution.

The above cleaning solution may comprise a strong acid.

This permits removal of the foreign particles and oxidation, dissolution and removal of organic and inorganic substances to be performed in the same cleaning step.

Examples of the strong acid include sulfuric acid.

By use of the cleaning solution containing such a strong acid, organic and inorganic substances can be removed while the foreign particles are being removed, and when a compound that combines with the foreign particles by sulfate ester bonding is used, the formation of sulfate ester bonds can be promoted by the dehydrating action of sulfuric acid.

The cleaning solution may comprise a fluorine compound such as hydrogen fluoride, fluorosulfuric acid or ammonium fluoride.

By use of the cleaning solution containing such a fluorine compound, the surface of the semiconductor device can be etched so that the foreign particles adhering to the surface can be easily liberated. In addition, the surfaces of the foreign particles are also etched, which allows easy bonding between the component for increasing the apparent diameter of the foreign particles and the foreign particles.

The cleaning solution may comprise an oxidizer such as hydrogen peroxide.

By use of the cleaning solution containing such an oxidizer, the foreign particles can be removed and organic and inorganic substances can be oxidated, dissolved and removed in the same cleaning step.

The cleaning solution may comprise sulfuric acid, hydrogen fluoride and hydrogen peroxide.

Use of such a cleaning solution permits removal of the foreign particles and oxidation, dissolution and removal of organic and inorganic substances to be performed in the same cleaning step. When a compound that combines with the foreign particles by sulfate ester bonding is used, the formation of sulfate ester bonds can be promoted by the dehydrating action of sulfuric acid. In addition, the surface of the semiconductor device is etched by hydrogen fluoride, leading to easy liberation of the foreign particles adhering to the surface and the surfaces of the foreign particles are also etched so that the component for increasing the apparent diameter of the foreign particles can be easily bonded to the foreign particles.

BEST MODE FOR CARRYING OUT THE INVENTION

Now, a semiconductor device cleaning method according to an embodiment of the invention will be explained.

A cleaning solution is prepared by blending 24 wt % sulfuric acid, 5 wt % hydrogen peroxide, 0.02 wt % hydrogen fluoride, 0.075 wt % n-dodecylbenzenesulfonic acid and water.

The weight percentage of each component is not limited to that specified above. For example, the amount of hydrogen fluoride may be determined according to the desired cleaning time and etching rate. If the concentration of sulfuric acid is too high, the stability of the cleaning solution decreases and the rate of etching caused by hydrogen fluoride decreases.

Although it is conceivable to mix hydrogen fluoride and other components at the same time, this leads to a decrease in the etching ability of the cleaning solution after a long time has elapsed after mixing. In view of this, it is desired that other components are mixed beforehand and hydrogen fluoride is added to the mixture just before cleaning.

Figure 1:
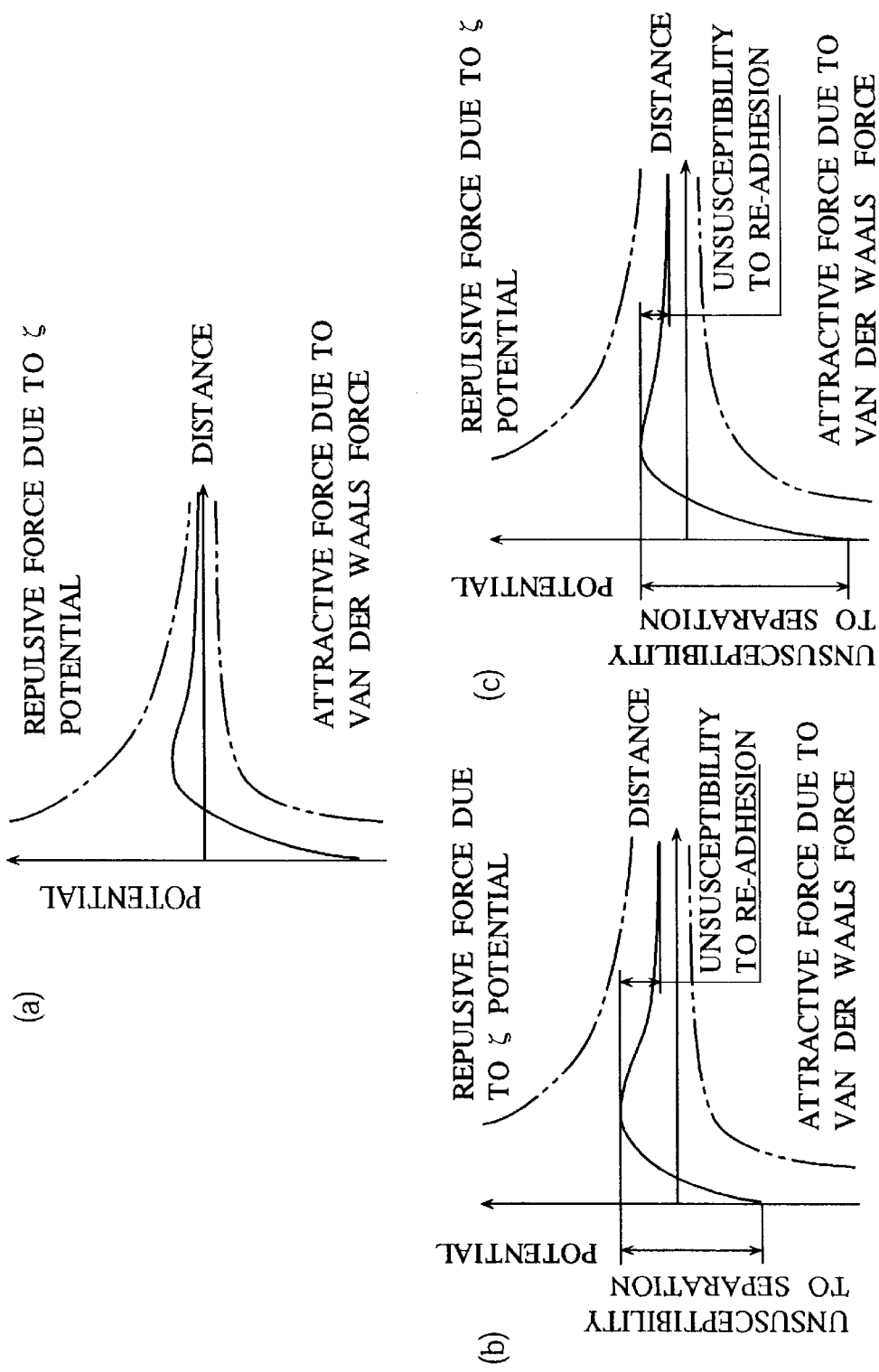
FIGS. 1(a)–(c) illustrates the potential energy of foreign particles.
Figure 2:
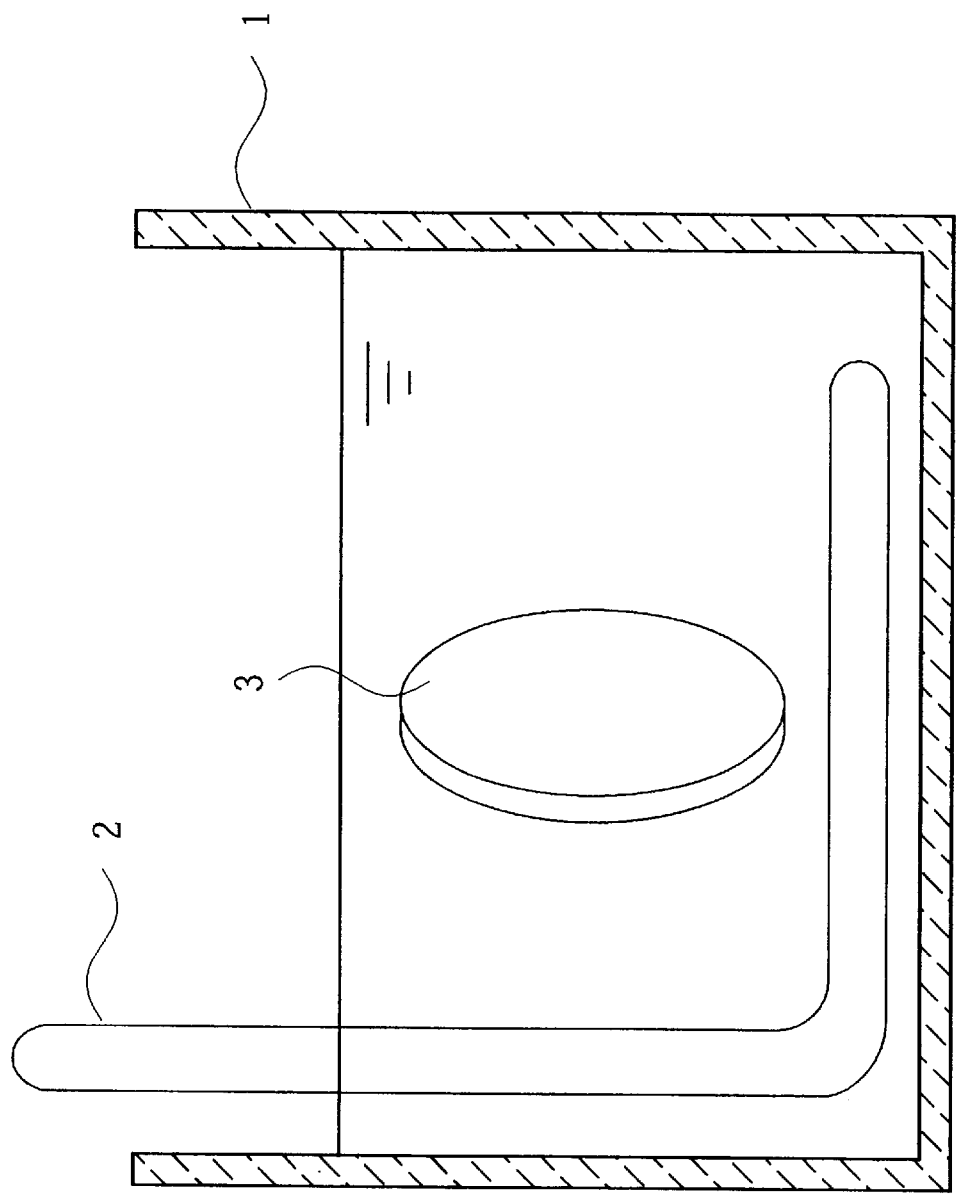
FIG. 2 diagrammatically shows the construction of a leaning system.

The cleaning solution is put in a processing vessel 1 made from quartz as shown in FIG. 2, heated by a heater 2 and maintained at a temperature of 25° C. The higher the temperature at which the cleaning solution is maintained, the more rapidly the reaction proceeds. However, if this temperature is too high, the stability of the cleaning solution decreases, and therefore this temperature should be about 100° C. or less and more desirably 90° C. or less. Such a temperature range has proven to be effective in achieving the inventive effect.

After a silicon wafer 3 serving as a semiconductor device has been immersed for 10 minutes in the cleaning solution within the quartz processing vessel 1, the silicon wafer 3 is subjected to overflow water washing (rising) for 7 minutes using demineralized water and then dried by a spin drier or the like. In this process, organic substances and inorganic substances such as heavy metal are removed by sulfuric acid and hydrogen peroxide contained in the cleaning solution of the invention, similarly to the prior art cleaning solution. At the same time, minute foreign particles are effectively removed by virtue of the function of n-dodecylbenzenesulfonic acid contained in the cleaning solution.

There will be explained the mechanism of the removal of minute foreign particles.

When the silicon wafer 3 is immersed in the cleaning solution, its surface is slightly etched by hydrogen fluoride contained in the cleaning solution at an etching rate of about 1.0 nm/min. The foreign particles adhering to the surface of the silicon wafer 3, that are, silicon (Si), silicon oxide (SiOx) and others as well as the organic/inorganic substances which have not been decomposed or dissolved away by sulfuric acid etc. are liberated from (lift off) the surface so that they are dispersed into the cleaning solution.

Figure 3:
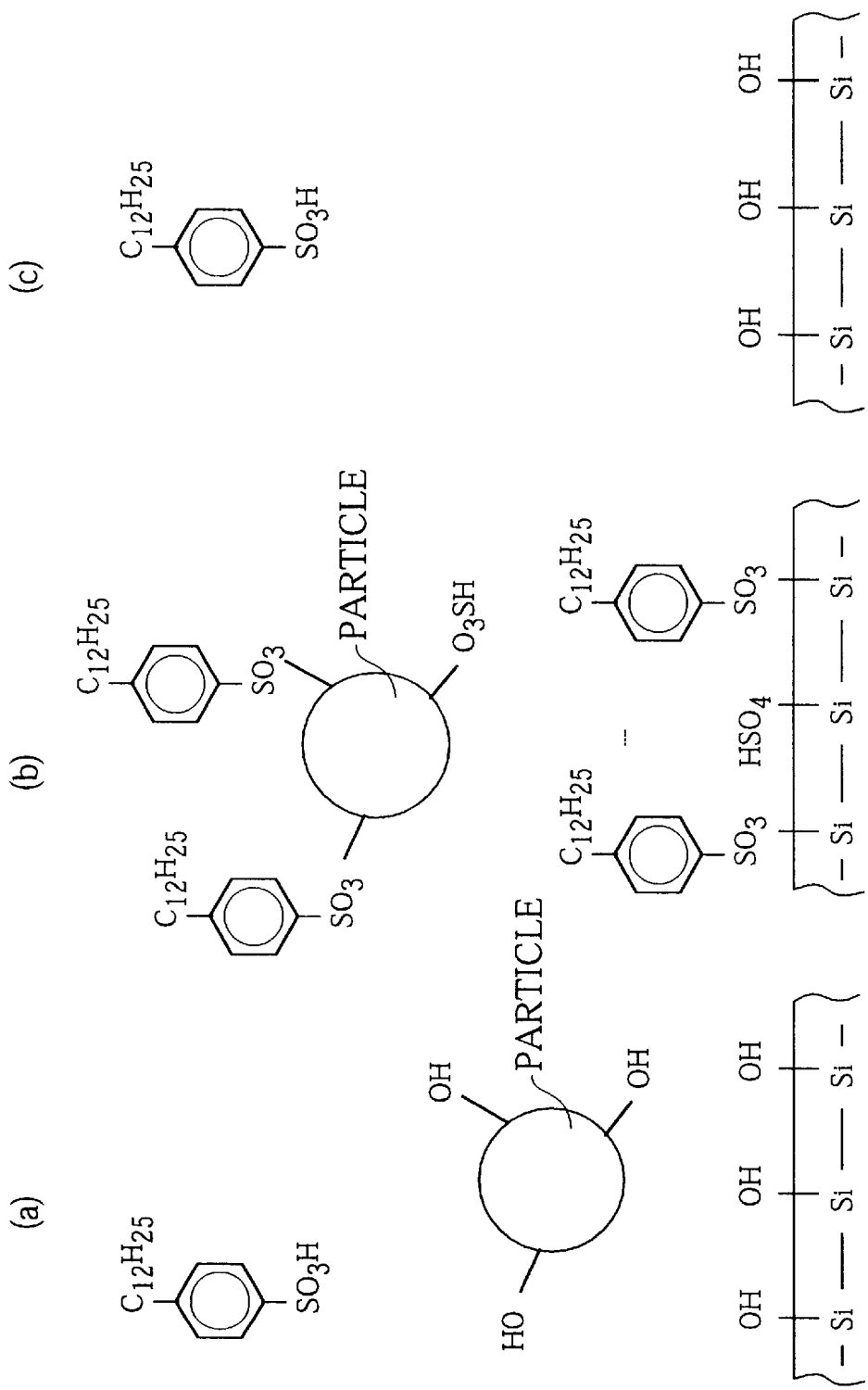
FIGS. 3(a)–(c) illustrates the mechanism of particle removal.

The surfaces of the foreign particles are also etched during the etching of the surface of the silicon wafer 3 so that OH groups are bonded to their respective surfaces as shown in FIG. 3(a). An OH group and the sulfonic acid group of n-dodecylbenzenesulfonic acid form a sulfate ester bond through dehydration so that n-dodecylbenzenesulfonic acid is bonded to the surfaces of the silicon wafer 3 and to the foreign particles as shown in FIG. 3(b).

It is conceivable that since n-dodecylbenzenesulfonic acid has hydrophilic groups (sulfonic acid groups) and hydrophobic groups (benzene nucleuses), the hydrophobic group of an n-dodecylbenzenesulfonic acid molecule bonded to the surface of a foreign particle and the hydrophobic groups of other n-dodecylbenzenesulfonic acid molecules are attracted and physically adsorbed to one another owing to intermolecular forces, forming a structure, in which the hydrophilic groups face outward, around a foreign particle so that double or triple adsorption layers are formed.

Although sulfuric acid ions are conceivably bonded to the surfaces of the silicon wafer 3 and the foreign particles, n-dodecylbenzenesulfonic acid having a higher molecular weight is more likely to combine with the wafer and particle surfaces in a stable condition.

Figure 4:
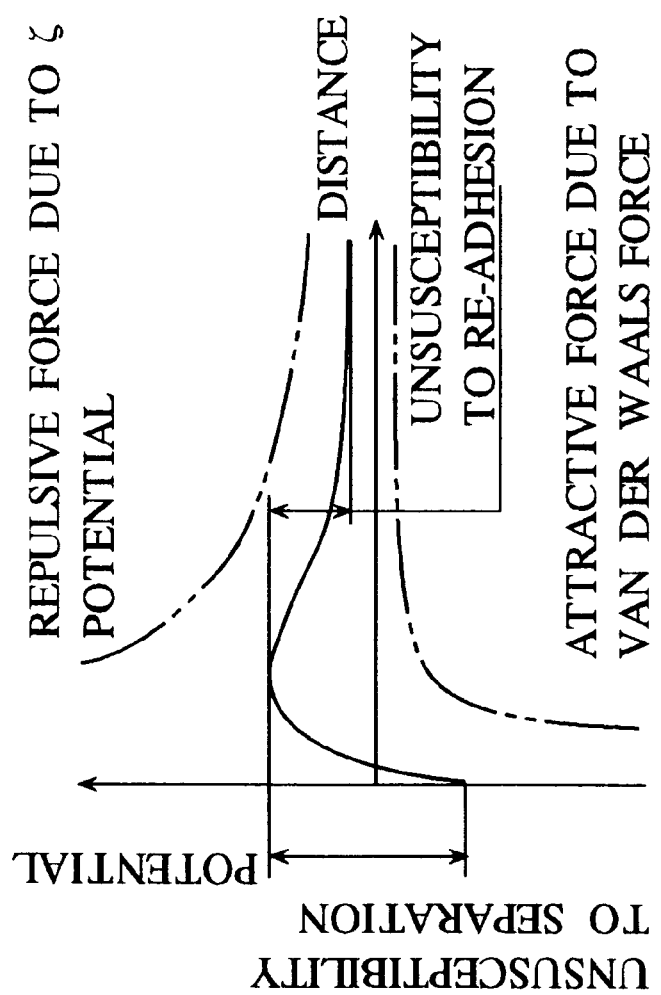
FIG. 4 illustrates the potential energy of foreign particles to which n-dodecylbenzenesulfonic acid is bonded.

The foreign particles to which n-dodecylbenzenesulfonic acid as been bonded increase in molecular weight and therefore in apparent diameter. Therefore, the surface area of the foreign articles increases and the repulsive force caused by $\zeta$ potential etc. relatively increases, so that potential energy is as shown in FIG. 4. In consequence, the foreign particles are unlikely to adhere to. the surface of the silicon wafer 3 once they have separated from it. Even if they adhere to the surface of the silicon wafer 3 again, they will easily come off the surface.

The foreign particles can be therefore easily washed away in the subsequent water cleaning step.

In the water cleaning step, the n-dodecylbenzenesulfonic acid bonded to the surface of the silicon wafer 3 by sulfate ester bonding is easily hydrolysed as shown in FIG. 3(c) and therefore washed away easily, so that a contamination-free silicon wafer 3 can be obtained.

Although the foregoing example has been described with a case where n-dodecylbenzenesulfonic acid is used as a component which combines with foreign particles by sulfate ester bonding, this component is not limited to n-dodecylbenzenesulfonic acid but may be p-toluenesulfonic acid or one of its isomers. Where any one of these substances is used, concentration, processing temperature and immersing time may be optimized according to the chemical adsorption properties of the used substance relative to the foreign particles.

Although hydrogen fluoride is used as a fluorine compound in the foregoing example, the same effect can be obtained by use of fluorosulfuric acid or ammonium fluoride.

Sulfuric acid is not an essential element, but use of sulfuric acid permits removal of organic and inorganic substances to be carried out simultaneously with removal of foreign particles as disclosed earlier and promotes formation of sulfate ester bonds by its dehydrating action.

Ozone or the like may be used as an oxidizer for effectively removing organic substances in place of hydrogen peroxide.

While the silicon wafer 3 is simply immersed in the cleaning solution in the foregoing example, other known techniques may be employed in combination with the immersion, which techniques include circulation of the cleaning solution after filtration and the megasonic technique utilizing ultrasonic.

The objects to be cleaned are not limited to silicon wafers. The cleaning method of the invention is applicable to semiconductor devices of sebral materials such as silicon, oxides and glasses, and of several forms such as substrates and so on.

(Test Example)

Now there will be given an explanation on a test example that verifies the effect of the semiconductor device cleaning method according to the embodiment of the invention.

First, two types of cleaning solutions A and B (details are described below) were prepared as comparative examples and a cleaning solution C was prepared according to the embodiment of the invention.

Cleaning solution A: 0.1 wt % hydrogen fluoride was dissolved in water.

Cleaning solution B: 24 wt % sulfuric acid, 5 wt % hydrogen peroxide, 0.02 wt % hydrogen fluoride and water were blended.

The cleaning solutions A to C were sufficiently filtered using a filter of 0.2 $\mu$m thereby ascertaining that foreign particles having a diameter of 0.3 $\mu$m or more do not exist in each cleaning solution. Then, $8 \times 10^{-5}$ wt % polylatex particles (organic substance) having a diameter of 0.41 $\mu$m were added to each cleaning solution and sufficiently stirred.

A clean silicon wafer was immersed in each of the cleaning solutions A to C for 10 minutes. After that, each silicon wafer was cleaned by over-flow water washing for about 7 minutes using demineralized water and then dried with a spin drier.

Figure 5:
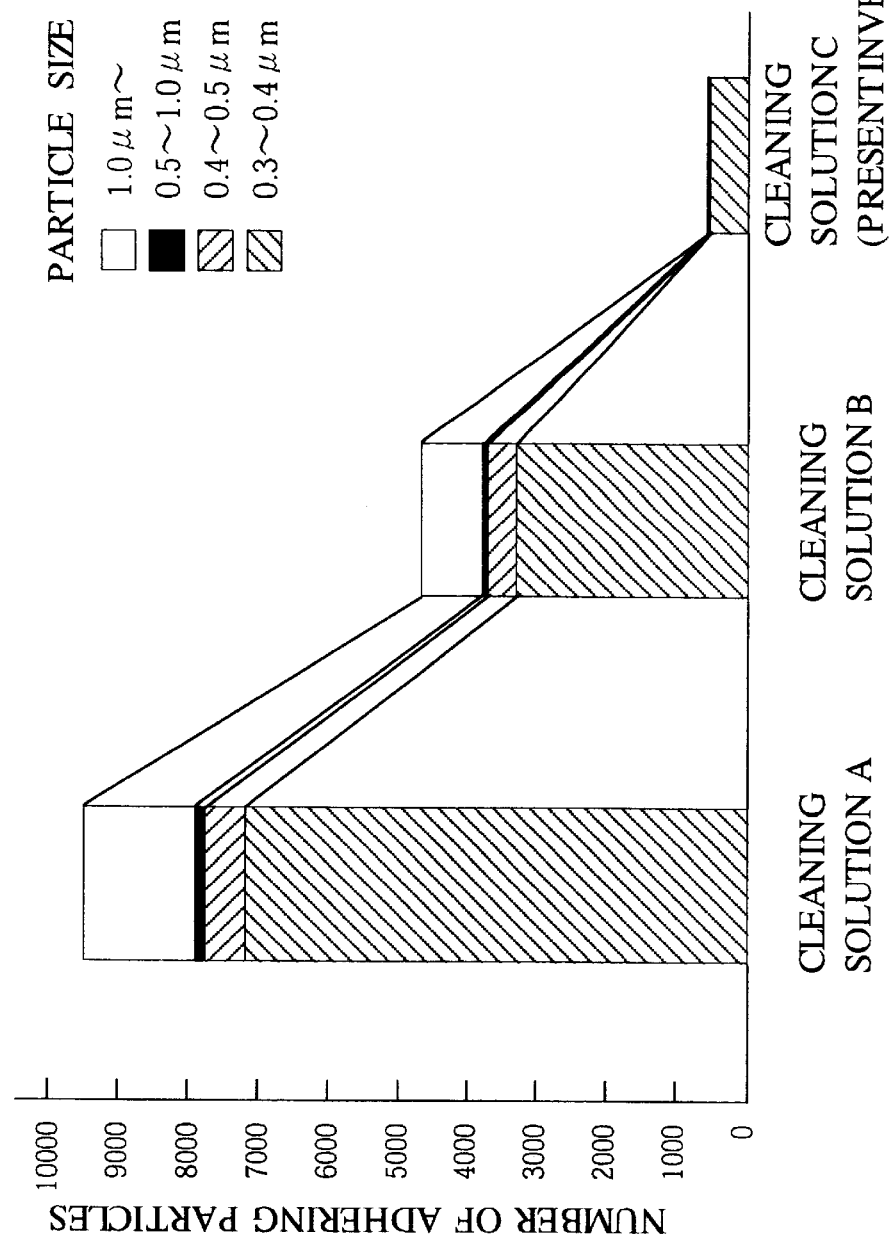
FIG. 5 shows the result of cleaning in a test example.

The number of foreign particles adhering to the surface of each silicon wafer thus cleaned was counted with a foreign matter inspection device incorporating a laser system. It has been found from the result that, as shown in FIG. 5, a large number of foreign particles were adhering to the surface of the silicon wafer cleaned by the cleaning solution A which forms a hydrophobic surface. The number of foreign particles adhering to the silicon wafer cleaned with the cleaning solution B is still pretty large, that is, about one half that of the case where the silicon wafer was cleaned with the cleaning solution A. In contrast with these known cleaning solutions, the cleaning solution C containing n-dodecylbenzenesulfonic acid reduced the number of foreign particles to about one twentieth that of the case where the silicon wafer was cleaned with the cleaning solution A. It is believed that the same effective removal is possible with the cleaning solution C even when more minute foreign particles having, for example, a diameter of about 0.1 $\mu$m or less are removed, although experimental confirmation is quite difficult to present.

INDUSTRIAL APPLICABILITY

As has been described earlier, according to the invention, a semiconductor device is cleaned with a cleaning solution comprising a component which combines with foreign particles by sulfate ester bonding thereby to increase the apparent diameter of the foreign particles, such as toluenesulfonic acid and dodecylbenzenesulfonic acid, so that the surface area of the foreign particles increases and the repulsive force caused by $\zeta$ potential etc. relatively increases. With this arrangement, the foreign particles are likely to separate from the surface of the semiconductor device and unlikely to adhere again to the surface of the semiconductor device once they have separated from it. Even if they adhere again to the surface of the semiconductor device, they will easily come off the surface.

Accordingly, the cleaning method of the invention is capable of effectively removing minute foreign particles which adhere to silicon wafers, oxides, glasses and other substrates and is therefore useful in cleaning of such a wide variety of semiconductor devices.

What is claimed is:

1. A method of cleaning a semiconductor device comprising the steps of:

contacting a surface of a semiconductor device with a cleaning solution comprising a compound that combines by a sulfate ester bonding with foreign particles composed of silicon or silicon dioxide on said surface of the semiconductor device and with said foreign particles being liberated from said surface of the semiconductor device to increase a diameter of said foreign particles; and thereafter removing said foreign particles adhered on said surface of the semiconductor device by removing said cleaning solution from said surface of the semiconductor device.

2. A method of cleaning a semiconductor device according to claim 1, further comprising, following the removal step, rinsing said semiconductor device with a demineralized water or an organic compound.

3. A method of cleaning a semiconductor device according to claim 1, wherein said cleaning solution further comprises a strong acid.

4. A method of cleaning a semiconductor device according to claim 1, wherein said cleaning solution further comprises a fluorine compound.

5. A method of cleaning a semiconductor device according to claim 1, wherein said cleaning solution further comprises an oxidizer.

6. A method of cleaning a semiconductor device according to claim 1, wherein said cleaning solution further comprises sulfuric acid, hydrogen fluoride and hydrogen peroxide.

7. A method of cleaning a semiconductor device according to claim 2, wherein said compound has sulfonic acid groups and benzene nucleuses.

8. A method of cleaning a semiconductor device according to claim 2, wherein said cleaning solution further comprises a strong acid.

9. A method of cleaning a semiconductor device according to claim 2, wherein said cleaning solution further comprises a flourine compound.

10. A method of cleaning a semiconductor device according to claim 2, wherein said cleaning solution further comprises an oxidizer.

11. A method of cleaning a semiconductor device according to claim 2, wherein said cleaning solution further comprises sulfuric acid, hydrogen flouride and hydrogen peroxide.

12. A method of cleaning a semiconductor device according to claim 3, wherein said strong acid is sulfuric acid.

13. A method of cleaning a semiconductor device according to claim 4, wherein said fluorine compound is at least one substance selected from the group consisting of hydrogen fluoride, fluorosulfuric acid and ammonium fluoride.

14. A method of cleaning a semiconductor device according to claim 5, wherein said oxidizer is hydrogen peroxide.

15. A method of cleaning a semiconductor device according to claim 7, wherein said compound is p-toluenesulfonic acid or n-dodecylbenzenesulfonic acid.

16. A method of cleaning a semiconductor device according to claim 7, wherein said cleaning solution further comprises a strong acid.

17. A method of cleaning a semiconductor device according to claim 7, wherein said cleaning solution further comprises a flourine compound.

18. A method of cleaning a semiconductor device according to claim 7, wherein said cleaning solution further comprises an oxidizer.

19. A method of cleaning a semiconductor device according to claim 7, wherein said cleaning solution further comprises sulfuric acid, hydrogen flouride and hydrogen peroxide.

20. A method of cleaning a semiconductor device according to claim 15, wherein said cleaning solution further comprises a strong acid.

21. A method of cleaning a semiconductor device according to claim 15, wherein said cleaning solution further comprises a flourine compound.

22. A method of cleaning a semiconductor device according to claim 15, wherein said cleaning solution further comprises an oxidizer.

23. A method of cleaning a semiconductor device according to claim 15, wherein said cleaning solution further comprises sulfuric acid, hydrogen flouride and hydrogen peroxide.

* * * * *